(12) United States Patent
Aoki et al.

(10) Patent No.: US 11,980,048 B2
(45) Date of Patent: May 7, 2024

(54) DISPLAY DEVICE COMPRISING FIRST AREA INCLUDING PIXEL AND SECOND AREA INCLUDING TRANSPARENT AREA

(71) Applicant: Japan Display Inc., Tokyo (JP)

(72) Inventors: Hayata Aoki, Tokyo (JP); Masashi Tsubuku, Tokyo (JP); Toshinari Sasaki, Tokyo (JP)

(73) Assignee: Japan Display Inc., Tokyo (JP)

(*) Notice: Subject to any disclaimer, the term of this patent is extended or adjusted under 35 U.S.C. 154(b) by 43 days.

(21) Appl. No.: 17/699,224

(22) Filed: Mar. 21, 2022

(65) Prior Publication Data
US 2022/0310965 A1    Sep. 29, 2022

(30) Foreign Application Priority Data

Mar. 23, 2021   (JP) ................... 2021-048707

(51) Int. Cl.
*H10K 50/858*    (2023.01)
*H10K 50/81*     (2023.01)
*H10K 50/828*    (2023.01)

(52) U.S. Cl.
CPC ........... *H10K 50/828* (2023.02); *H10K 50/81* (2023.02); *H10K 50/858* (2023.02)

(58) Field of Classification Search
None
See application file for complete search history.

(56) References Cited

U.S. PATENT DOCUMENTS

| | | | |
|---|---|---|---|
| 2016/0043154 A1* | 2/2016 | Choi | H10K 59/122 438/23 |
| 2016/0315133 A1 | 10/2016 | Sato | |
| 2017/0330923 A1* | 11/2017 | Chung | H10K 59/875 |
| 2020/0212130 A1* | 7/2020 | Kim | H10K 50/818 |
| 2021/0013430 A1* | 1/2021 | Lee | C07F 5/00 |
| 2022/0165983 A1* | 5/2022 | Ha | H10K 71/00 |

\* cited by examiner

*Primary Examiner* — Daniel Whalen
(74) *Attorney, Agent, or Firm* — Michael Best & Friedrich LLP

(57) ABSTRACT

According to one embodiment, a display device comprises a first area including a pixel and a second area different from the first area, wherein the pixel comprises a pixel electrode, an organic material layer including a light-emitting layer, a common electrode, a first insulating layer, a second insulating layer having a refractive index lower than that of the first insulating layer, and a third insulating layer, the second area is an area not overlapping the light-emitting layer in plan view, the second area is a transparent area, and the second area comprises the first insulating layer provided therein, the second area does not comprise the second insulating layer.

5 Claims, 8 Drawing Sheets

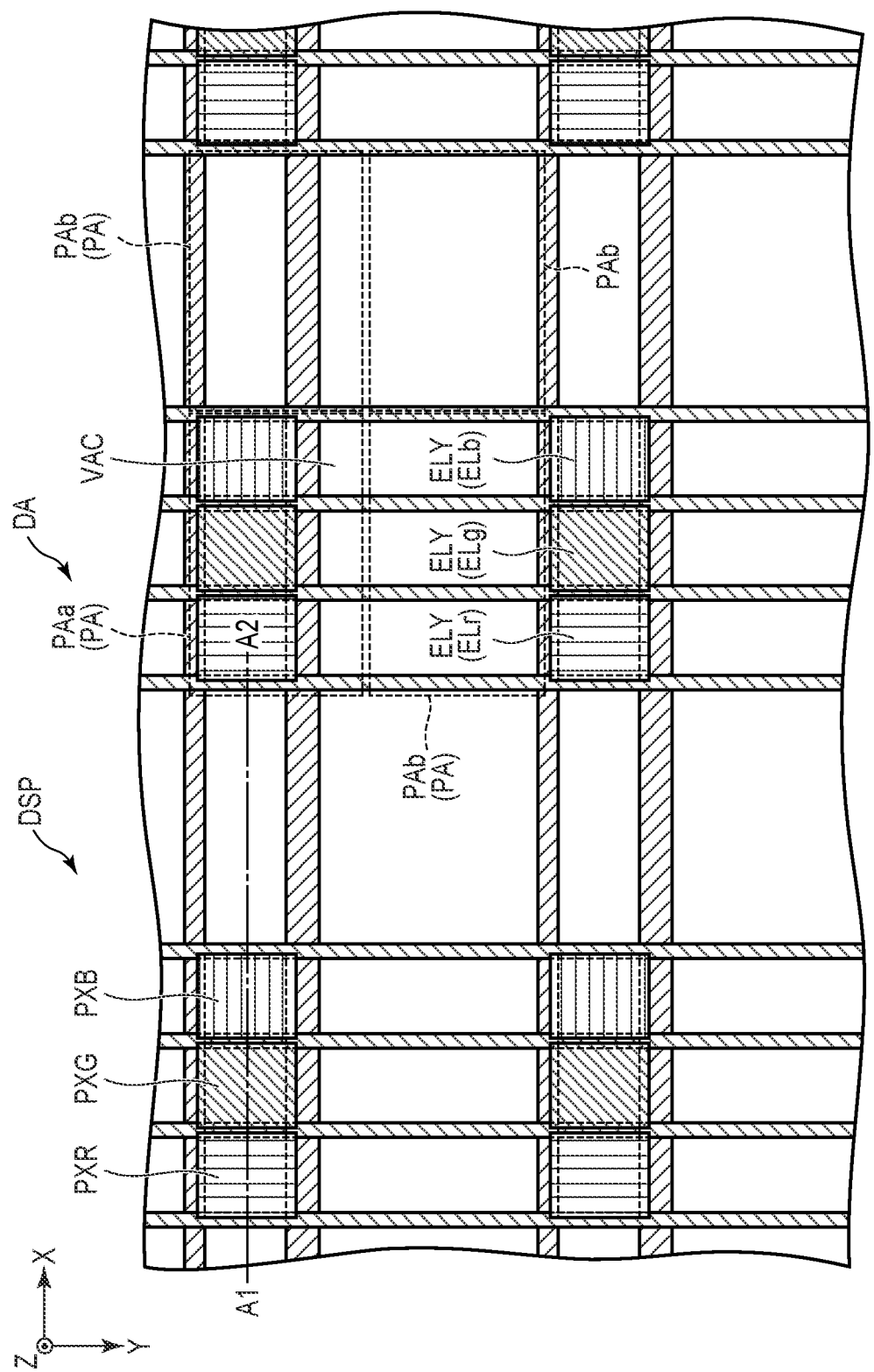
F I G. 2

DISPLAY DEVICE COMPRISING FIRST AREA INCLUDING PIXEL AND SECOND AREA INCLUDING TRANSPARENT AREA

CROSS-REFERENCE TO RELATED APPLICATIONS

This application is based upon and claims the benefit of priority from Japanese Patent Application No. 2021-048707, filed Mar. 23, 2021, the entire contents of which are incorporated herein by reference.

FIELD

Embodiments described herein relate generally to a display device.

BACKGROUND

A display device using an organic electroluminescence (EL) light-emitting material has been developed.

BRIEF DESCRIPTION OF THE DRAWINGS

FIG. 2 is a plan view showing a display area of the embodiment.

DETAILED DESCRIPTION

Figure 1:
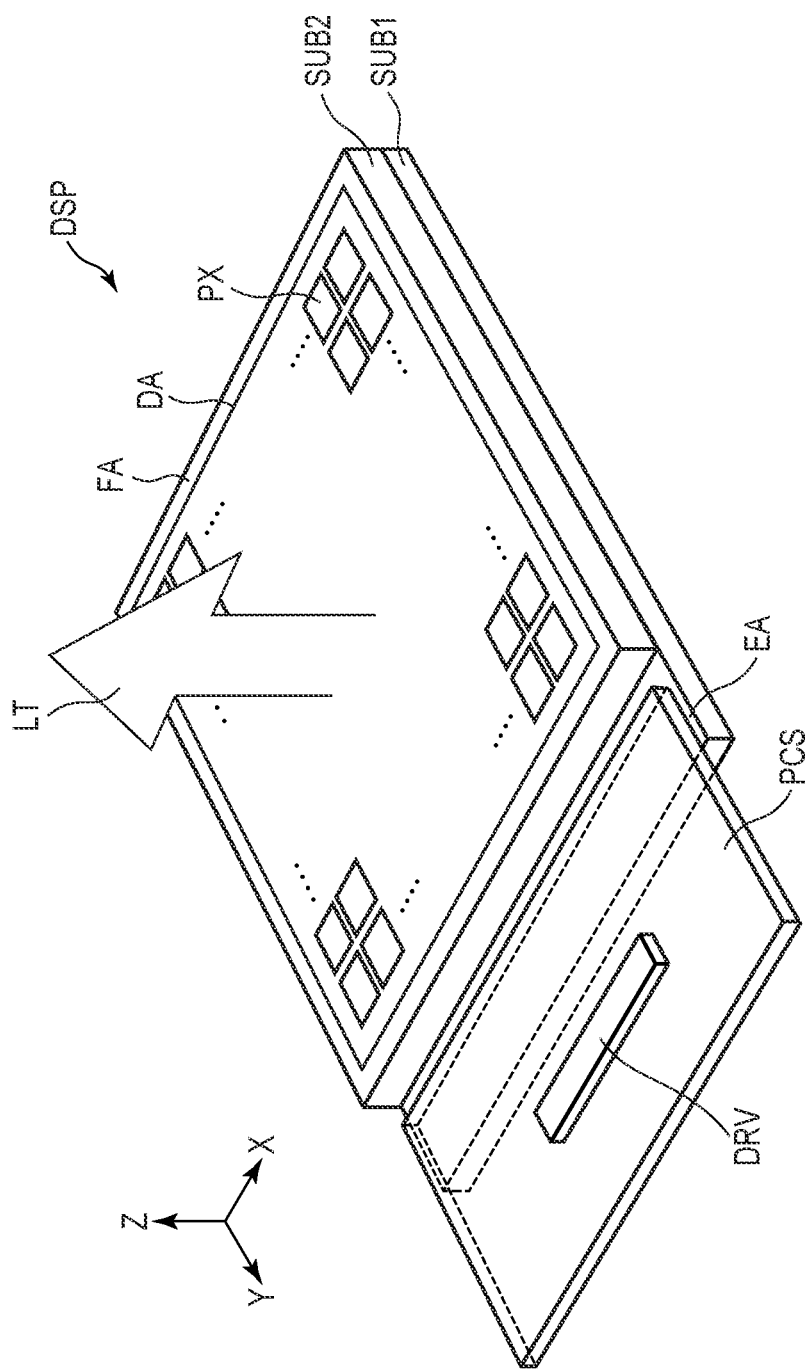
FIG. 1 is a perspective view showing a display device of an embodiment in its entirety.

In general, according to one embodiment, a display device comprises a first area including a pixel and a second area different from the first area, wherein the pixel comprises a pixel electrode, an organic material layer including a light-emitting layer, a common electrode, a first insulating layer, a second insulating layer having a refractive index lower than that of the first insulating layer, and a third insulating layer, the second area is an area not overlapping the light-emitting layer in plan view, the second area is a transparent area, and the second area comprises the first insulating layer provided therein, the second area does not comprise the second insulating layer.

According to the embodiment, it is possible to provide a display device which can expand the color reproducibility range and can suppress the lowering of the transmittance.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

A display device according to one embodiment will now be described in detail with reference to accompanying drawings.

In this embodiment, a first direction X, a second direction Y and a third direction Z are orthogonal to each other, but they may intersect at an angle other than 90 degrees. In the following descriptions, a direction forwarding a tip of an arrow indicating the third direction Z is referred to as "above" or "upward" and a direction forwarding oppositely from the tip of the arrow is referred to as "below" or "downward".

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in a third direction Z, and viewing from this observation position toward the X-Y plane defined by the first direction X and the second direction Y is referred to as a planar view. Viewing a cross section of the display device in an X-Z plane defined by the first direction X and the third direction Z or a Y-Z plane defined by the second direction Y and the third direction Z is referred to as a cross-sectional view.

EMBODIMENT

FIG. 1 is a perspective view showing a display device of an embodiment in its entirety. The display device DSP comprises a display area DA and a peripheral area FA provided around the display area DA on a substrate SUB1. The display device DSP includes a plurality of pixels PX arranged in the display area DA. In the display device DSP, light LT from a rear surface is transmitted to a front surface and vice versa.

On an upper surface of the display area DA, a substrate SUB2 is provided as a sealing member. The substrate SUB2 is fixed to the substrate SUB1 by a sealing material (not shown) surrounding the display area DA. The display area DA formed on the substrate SUB1 is sealed by the substrate SUB2 as a sealing member, and the sealant material to prevent it from being exposed to the atmosphere.

An area EA in an end portion of the substrate SUB1 is located on an outer side of the substrate SUB2. In the area EA, a wiring substrate PGS is provided. The wiring substrate PGS is provided with a drive element DRV that outputs video signals and drive signals. The signals from the drive element DRV are input to the pixels PX in the display area DA via the wiring substrate PGS.

FIG. 2 is a plan view showing the display area of the embodiment. The display area DA shown in FIG. 2 includes a plurality of individual areas PA. The individual areas PA are arranged in a matrix along the first direction X and the second direction Y.

FIG. 2 shows as an example in which there are four individual areas PA, and one of the four individual areas PA, which is, PAa, contains a pixel PXR emitting red light, a pixel PXG emitting green light and a pixel PXG emitting blue light. The pixels PXR, PXG and PXB are provided with organic EL layers ELY including light-emitting layers ELr, ELg and ELb, respectively. Note that when there is no need to distinguish between the light-emitting layers ELr, ELg, and ELb, they are referred to as light-emitting layers ELL. The light-emitting layers ELL is formed using organic electroluminescence (OEL) light-emitting material. The organic EL layers ELY will be described later.

Of the individual area PA, the region other than the pixels PX (PXR, PXG and PXB) is defined as a blank region VAC. The light-emitting layer ELL is not provided in the blank region VAC, where light is transmitted therethrough.

Those of the individual areas PA, which are different from the individual area PAa, are defined as individual areas PAb. The individual areas PAb are not provided with a light-emitting layer ELL as with the blank region VAC, and they are transparent areas through which light is transmitted. Details thereof will be described later. In this specification, the individual area PAa may as well be referred to as the first area, whereas the individual areas PAb as the second areas.

The ratio of the area occupied by the blank region VAC in the individual area PAa may be, for example, about 50% of the entire individual area PAa. For example, the occupied area occupied by one individual area PAa and that of one individual area PAb is, for example, the same. The number of individual areas PAb in the display area DA may be, for example, about three times the number of individual areas PAa.

As described above, the blank region VAC of the individual area PAa and the individual areas PAb are transparent regions. In the display device DSP of this embodiment, the area occupied by the transparent regions is greater than the area that emits light. Therefore, the display device DSP may be regarded as a transparent display.

Figure 3:
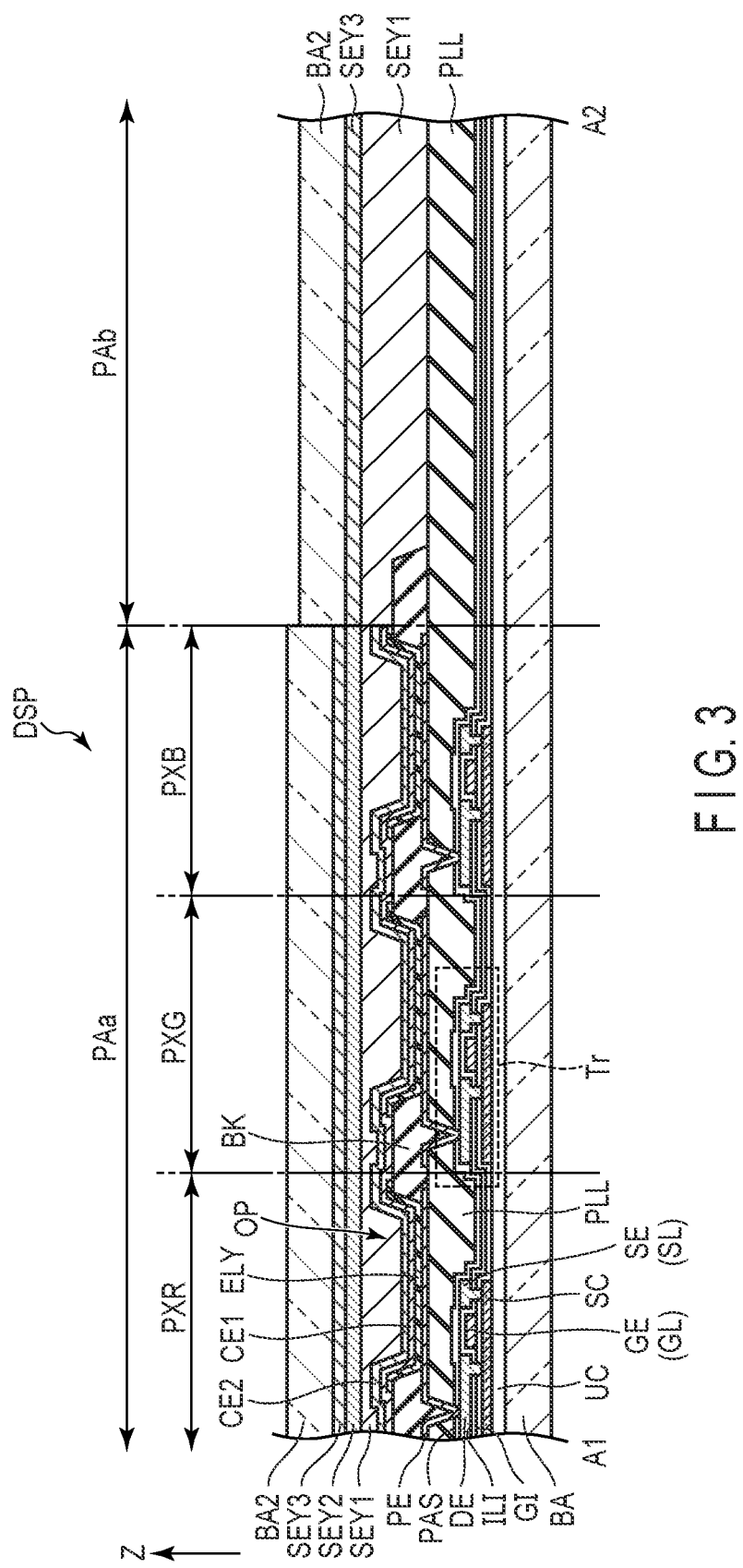
FIG. 3 is a cross-sectional view of the display device taken along line A1-A2 in FIG. 2.

FIG. 3 is a cross-sectional view of the display device taken along line A1-A2 in FIG. 2.

A base BA1 is made of, for example, glass or a resin material. Usable examples of the resin material are acryl, polyimide, polyethylene terephthalate, polyethylene naphthalate or the like, and further any of which may be formed in a single layer or a stacked body of multiple layers.

An insulating layer UC is provided on the base BA1. The insulating layer UC is formed, for example, by a single layer of a silicon oxide film or silicon nitride film, or a stacked layer of either one or both of these.

Transistors Tr are provided on the insulating layer UC. The transistors Tr each include a semiconductor layer SC, an insulating layer GI, a gate electrode GE (a scanning line GL), an insulating layer ILI, a source electrode SE (a signal line SL) and a drain electrode DE.

As the semiconductor layer SC, amorphous silicon, polysilicon, or oxide semiconductor is used.

As the insulating layer GI, for example, silicon oxide or silicon nitride is provided in the form of a single layer or in a staked layer.

As the gate electrode GE, for example, a molybdenum-tungsten alloy (MoW) is used. The gate electrode GE may be formed to be integrated with the scanning line GL.

The insulating layer ILI is provided to cover the semiconductor layer SC and the gate electrode GE. The insulating layer ILI is formed, for example, of a silicon oxide layer or silicon nitride layer in the form of a single layer or a stacked layer.

The source electrode SE and the drain electrode DE are provided on the insulating layer ILI. The source electrode SE and the drain electrode DE are connected to the source region and the drain region of the semiconductor layer SC via contact holes made in the insulating layer ILI and the insulating layer GI, respectively. Either one of the source electrode SE and the drain electrode DE may be formed to be integrated with the signal line SL.

An insulating layer PAS is provided to cover the source electrode SE, the drain electrode DE and the insulating layer ILI. An insulating layer PLL is provided to cover the insulating layer PAS.

The insulating layer PAS is formed of an inorganic insulating material. The inorganic insulating material may be, for example, a single layer or a stacked layer of silicon oxide or silicon nitride. The insulating layer PLL is formed of an organic insulating material. The organic insulating material is, for example, an organic material such as photosensitive acryl, polyimide, or the like. With the insulating layer PLL thus provided, stepped portions created by the transistors Tr can be planarized.

The pixel electrode PE is provided on the insulating layer PLL. The pixel electrode PE is connected to the drain electrode via contact holes made in the insulating layers PAS and PLL.

The pixel electrode PE may be of a stacked structure of a reflective first pixel electrode PE1 and a light-transparent second pixel electrode PE2. For example, as the material of the first pixel electrode PE1, silver (Ag) may be used, and as the material of the second pixel electrode PE2, indium tin oxide (ITO) or indium zinc oxide (IZO) may be used, and they may be stacked such that ITO or IZO is located at the uppermost surface of the structure. Another structure is that the pixel electrode PE may be formed in a stacked structure in which ITO or IZO, Ag, ITO or IZO are stacked in this order.

A bank BK(, which may be referred to as a projecting portion, a rib or a partition wall) is provided between each adjacent pair of pixel electrodes PE. As the material of the bank BK, an organic material similar to the material of the insulating layer PLL is used. The bank BK is opened so as to expose a part of the pixel electrode PE. Further, an end portion of the opening OP should preferably have a moderately tapered shape. If the end portion of the opening OP is steeply shaped, a coverage error may occur in the organic EL layer ELY, which will be formed later.

Each organic EL layer ELY is provided between each respective adjacent pair of banks BK to overlap the respective pixel electrode PE. The organic EL layer ELY includes a hole-injection layer, a hole-transport layer, an electron blocking layer, a light-emitting layer, a hole blocking layer, an electron transport layer, an electron injection layer and the like, which will be described in detail later. In this specification, the organic EL layer ELY may as well be referred to as the organic material layer. The organic EL layer ELY includes at least a light-emitting layer, and other layers may be provided as necessary.

In order to make the drawing easier to read, FIG. 3 shows that the organic EL layer ELY is selectively provided for each pixel PX, but the configuration is not limited to this. Of the organic EL layer ELY, the light-emitting layer ELL is selectively provided for each pixel PX. Note that the other layers of the organic EL layer ELY are formed to be integrated as one body over the entire pixel PX. This will be described in detail later.

A first common electrode CE1 and a second common electrode CE2 are provided to cover the respective organic EL layer ELY and the respective bank BK. The first common electrode CE1 and the second common electrode CE2 are collectively referred to as a common electrode CE.

As the first common electrode CE1, a magnesium-silver alloy (MgAg) film or ytterbium-silver alloy (YbAg) film are formed as such a thin film that light emitted from the organic EL layer ELY can be transmitted though. The first common electrode CE1 is formed by co-deposition to have a film thickness of, for example, 1 nm or more but 50 nm or less. The first common electrode CE1 has both transmissive and reflective properties, and the transmittance thereof is, for example, about 40%. In this embodiment, the first common electrode CE1 may be called a semi-transmissive electrode or a semi-transparent electrode.

As the second common electrode CE2, a transparent electrode of, for example, indium tin oxide (ITO) or indium zinc oxide (IZO) is formed. The transmittance of the second common electrode CE2 is higher than the transmittance of the first common electrode CE1.

In this embodiment, the common electrodes CE are provided in the individual area PAa, but not in the individual areas PAb. Further, although not shown in the figure, the blank region VAC in the individual area PAa has a configuration similar to that of the individual areas PAb, and no common electrode CE is provided therein. Note, however, that the second common electrode CE2 of the common electrodes may be provided in the individual areas PAb.

In this embodiment, the pixel electrodes PE serve as anodes and the common electrodes CE serve as cathodes. The light emission generated in the organic EL layer ELY is extracted upward. In other words, the display device DSP has a top emission structure.

In the individual area PAa, an insulating layer SEY1 is provided to cover the second common electrode CE2. The insulating layer SEY1 is an optical adjustment layer and is an insulating layer with a high refractive index. The insulating layer SEY1 is made of an inorganic or organic insulating material with, for example, a refractive index of 1.6 to 2.2 at a wavelength of 633 nm.

An insulating layer SEY2 is provided on the insulating layer SEY1. The insulating layer SEY2 is also an optical adjustment layer and is an insulating layer with a low refractive index. The insulating layer SEY2 is made of an inorganic or organic insulating material with, for example, a refractive index of 1.2 to 1.6 at a wavelength of 633 nm.

An insulating layer SEY3 is provided on the insulating layer SEY2. The insulating layer SEY3 has the function of preventing moisture from entering the organic EL layers. The material of the insulating layer SEY3 is, for example, an inorganic insulating material containing nitrogen, more specifically, silicon nitride, aluminum nitride or the like.

On the other hand, in the individual areas PAb, the low refractive-index insulating layer SEY2 is not provided, and the high refractive-index insulating layer SEY1 is provided on the insulating layer PLL.

If a low refractive-index insulating layer is provided on the individual areas PAb, which is a transparent region, a decrease in transmittance or wavelength dependency of the transmittance may be caused. Therefore, in this embodiment, a low refractive-index insulating layer is not provided in the individual areas PAb. With this structure, it is possible to suppress the decrease in transmittance.

On the insulating layer SEY1, the insulating layer SEY3 is provided. On the insulating layer SEY3, a base BA2 is provided. The base BA2 is made of a material similar to that of the base BA1. Or, the base BA2 may not be made of a material similar to that of the base BA1, but may be of some other transparent material.

Figure 4:
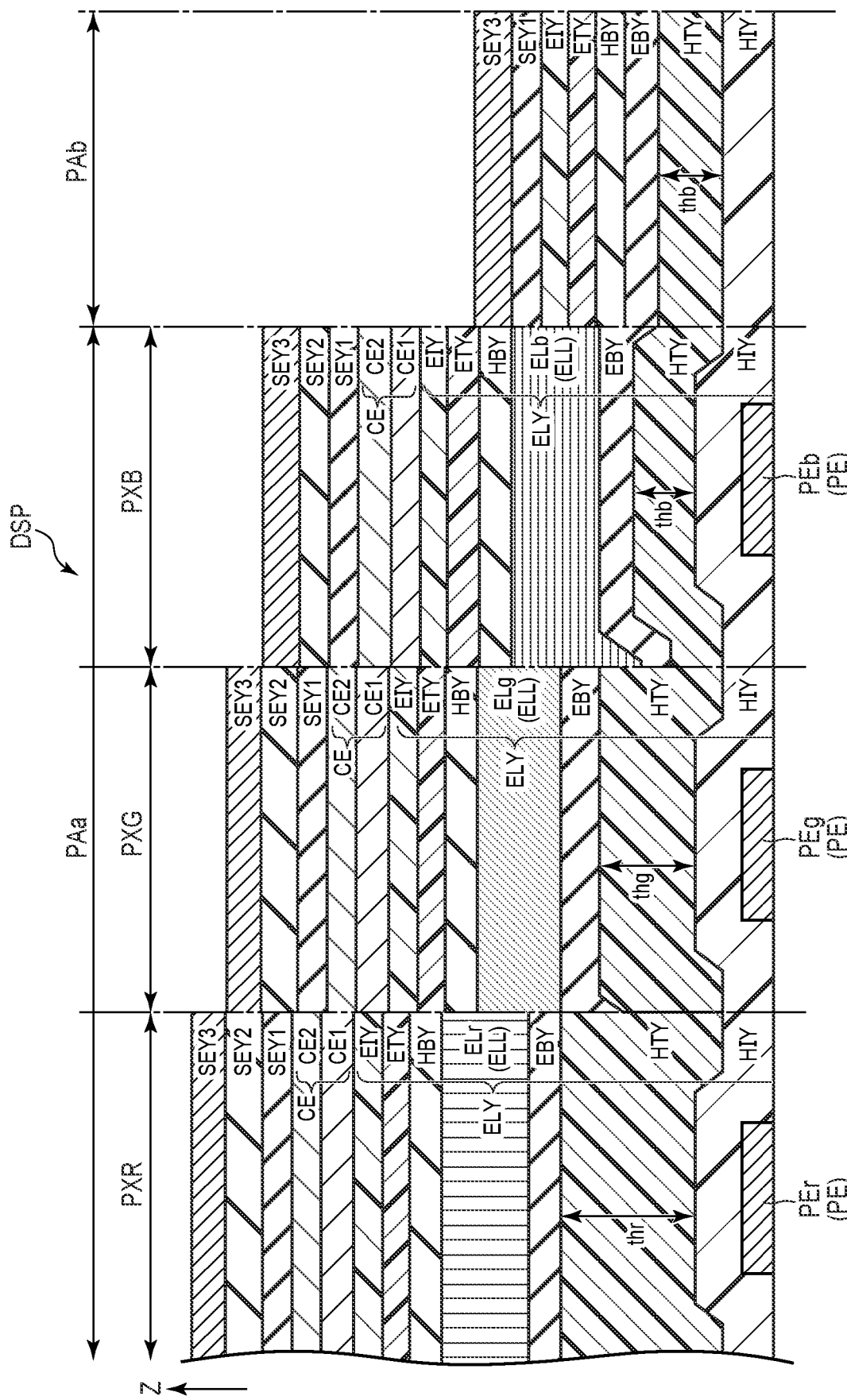
FIG. 4 is a partially enlarged view of FIG. 3.

FIG. 4 is a partially enlarged view of FIG. 3. FIG. 4 shows the structural components above the pixel electrodes PE in the pixels PXR, PXG and PXB of the individual area PAa, and the individual areas PAb. Note that FIG. 4 illustrates the stacked layer of each of the adjacent pixels, and the banks at the boundaries between pixels PXR, PXG and PXB are omitted from the drawing.

The pixel PXR includes, on a pixel electrode PEr, a hole injection layer HIY, a hole transport layer HTY, an electron blocking layer EBY, a light emission layer ELr (ELL), a hole blocking layer HBY, an electron transport layer ETY, an electron injection layer EIY, a first common electrode CE1, a second common electrode CE2, an insulating layer SEY1, an insulating layer SEY2 and an insulating layer SEY3.

The pixel PXG includes, on a pixel electrode PEr, a hole injection layer HIY, a hole transport layer HTY, an electron blocking layer EBY, a light emission layer ELg (ELL), a hole blocking layer HBY, an electron transport layer ETY, an electron injection layer EIY, a first common electrode CE1, a second common electrode CE2, an insulating layer SEY1, an insulating layer SEY2 and an insulating layer SEY3.

The pixel PXB includes, on a pixel electrode PEg, a hole injection layer HIY, a hole transport layer HTY, an electron blocking layer EBY, a light emission layer ELb (ELL), a hole blocking layer HBY, an electron transport layer ETY, an electron injection layer EIY, a first common electrode CE1, a second common electrode CE2, an insulating layer SEY1, an insulating layer SEY2 and an insulating layer SEY3.

The hole injection layer HIY, the hole transport layer HTY, the electron blocking layer EBY, the hole blocking layer HBY, the electron transport layer ETY, the electron injection layer EIY, the first common electrode CE1, the second common electrode CE2, the insulating layer SEY1, the insulating layer SEY2 and the insulating layer SEY3 are provided on the entire surface over the pixels PXR, PXG and PXB. They are formed as so-called solid films.

The material of the hole injection layer HIY is a material with high efficiency in injecting holes from the anode (the pixel electrode PE). The hole transport layer HTY transports the injected holes to the light emitting layer ELL. The electron blocking layer EBY stores the electrons injected from the cathode (the common electrode CE) in the light-emitting layer ELL, and prevents them from leaking out to the hole transport layer HTY.

The electron injection layer EIY injects electrons from the anode, and the electron transport layer ETY transports the injected electrons to the light-emitting layer ELL. The hole blocking layer HBY stores the holes injected from the anode in the light emitting layer ELL and prevents them from leaking out to the electron transport layer ETY.

The thickness of the hole transport layer HTY is different from one pixel PX to another. Here, let us set the thicknesses of the hole transport layers HTY in the pixels PXR, PXG and PXB to thr, thg, and thb, respectively. Then, the film thicknesses thr, thg and thb satisfy the relationship thr>thg>thb. Note that the thicknesses of the hole transport layers HTY in this embodiment are not limited to these, but they can be determined as appropriate, depending on the luminous efficiency of the light-emitting layer ELL, for example.

As to the hole injection layer HIY, the electron blocking layer EBY, the hole blocking layer HBY, the electron transport layer ETY, the electron injection layer EIY, the first common electrode CE1, the second common electrode CE2, the insulating layer SEY1, the insulating layer SEY2 and the insulating layer SEY3, the film thickness should be constant regardless of what pixel PX it is.

In the pixels PX of this embodiment, the light emitted from the light-emitting layer ELL is emitted upward or downward. The light emitted upward is extracted to the outside via the common electrode CE. The light emitted downward is reflected by the first pixel electrode PE1 of the pixel electrode PE. The reflected light is reflected between the first pixel electrode PE1 and the first common electrode CE1. With this configuration, of the light emitted by the light-emitting layer ELL, the component having a wavelength equal to the distance of the reflection path or an integral multiple of the distance, only the light component with the wavelength is amplified. As a result, light with a high peak intensity and a narrow spectrum can be extracted, and the color reproduction range of the display device DSP can be expanded (the microcavity effect).

As described above, in the individual areas PAb, the common electrode CE and the insulating layer SEY2 are not provided. With the structure with no low refractive-index insulating layers provided in the individual areas PAb, it is possible to suppress the decrease in transmittance and the wavelength dependency of transmittance.

Note that it suffices if the thickness of the hole transport layer HTY provided in the individual area PAb is the same as that of the thickness of the pixel PXB, which is the thinnest pixel in the individual area PAa.

Note that in the blank region VAC of the individual area PAa, the common electrode CE and the insulating layer SEY2 may not be provided.

In the individual areas PAb, which are transparent areas and further in the blank region VAC of the individual area PAa, the transmittance does not decreases. Thus, a highly transparent display device DSP can be obtained.

Figure 5:
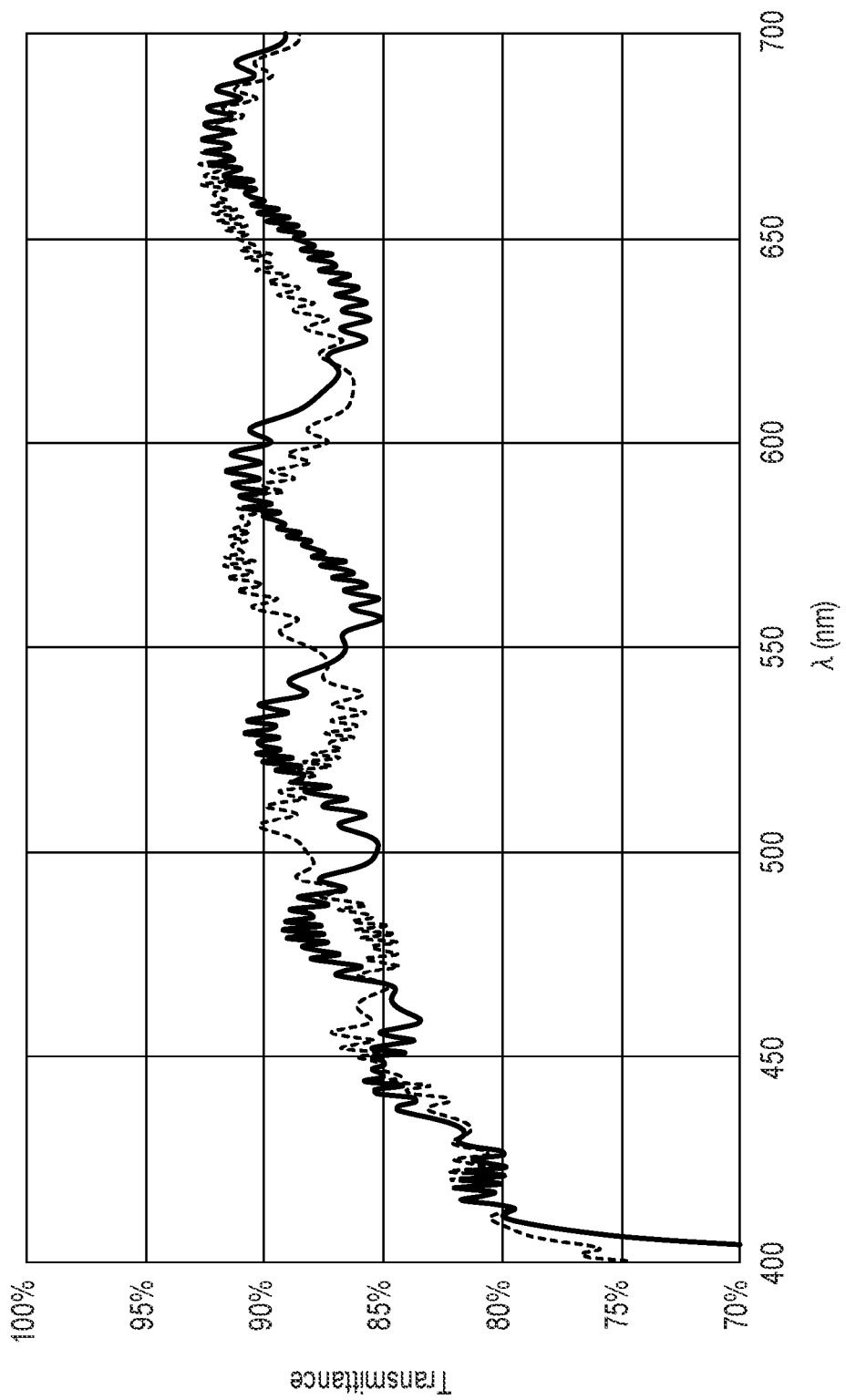
FIG. 5 is a diagram showing the transmittance of each of the display device of the embodiment and that of Comparative Example 1.
Figure 6:
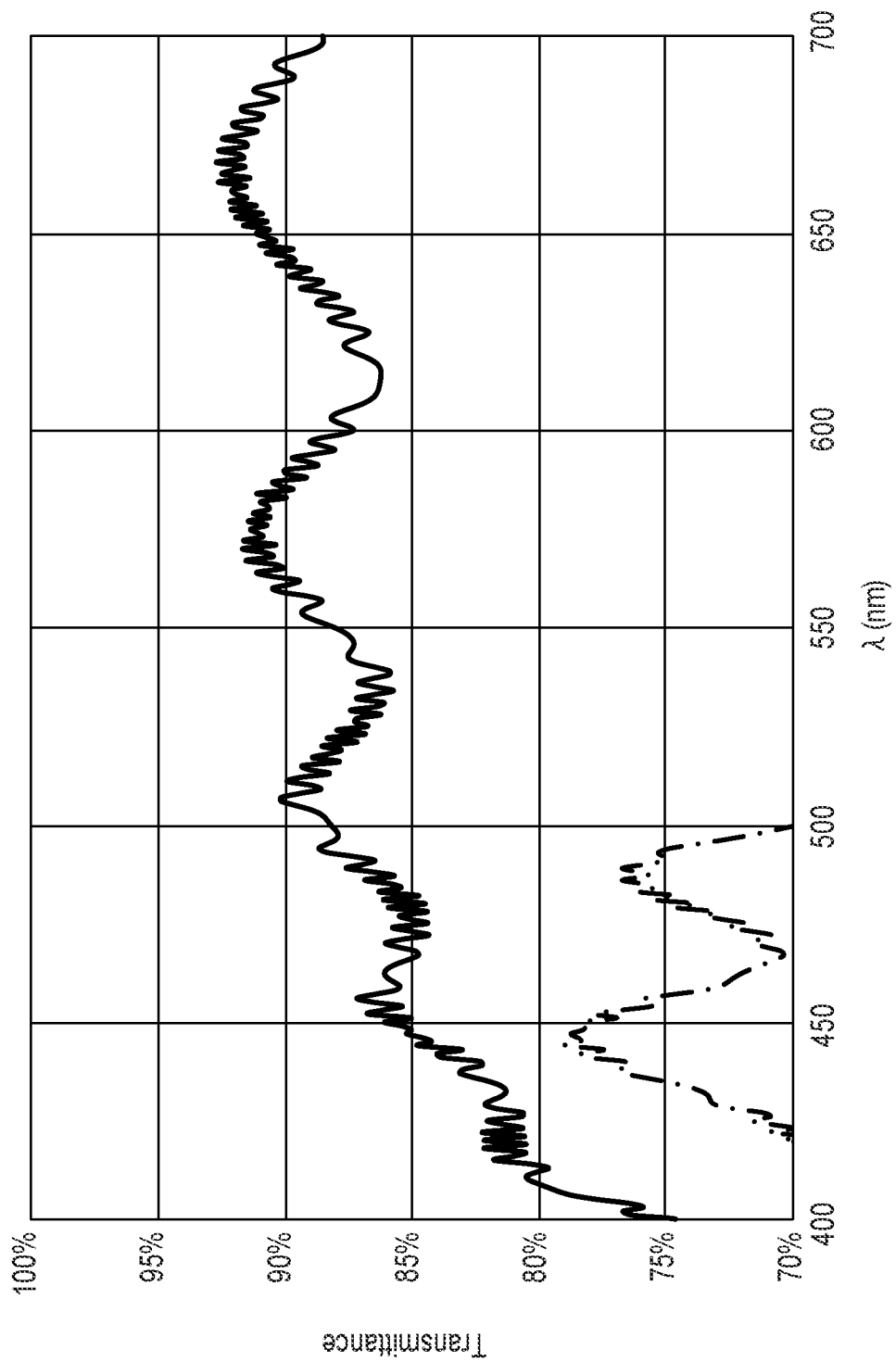
FIG. 6 is a diagram showing the transmittance of each of the display device of the embodiment and that of Comparative Example 2.
Figure 7C:
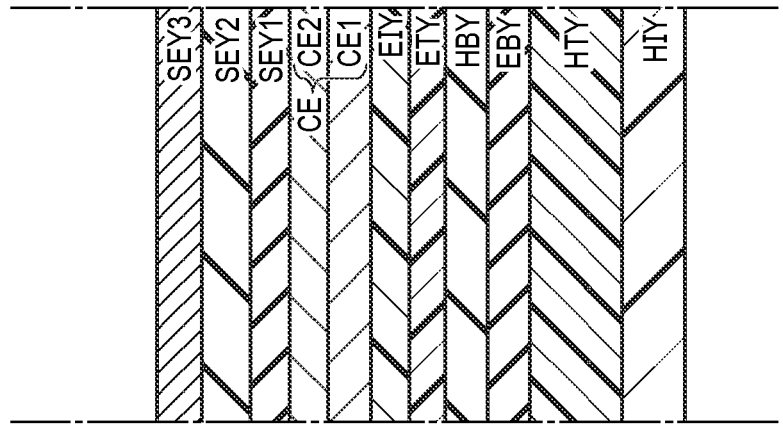
FIG. 7C is a partial cross-sectional view of Comparative Example 2.
Figure 7B:
FIG. 7B is a partial cross-sectional view of Comparative Example 1.
Figure 7A:
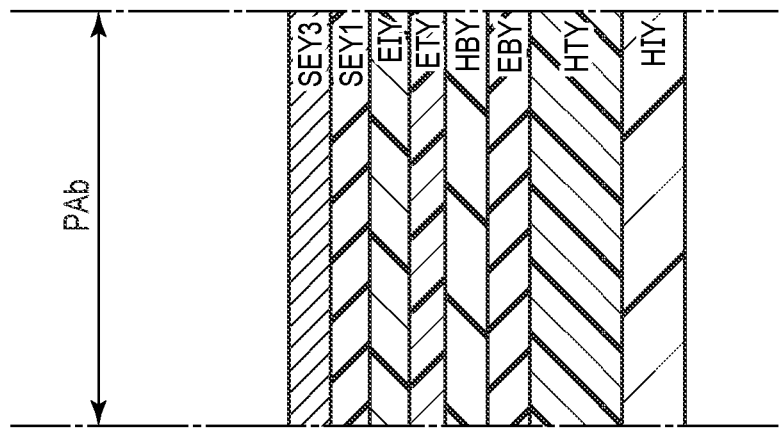
FIG. 7A is a partial cross-sectional view of the embodiment.

FIG. 5 is a diagram showing the transmittance of the display device of each of this embodiment and Comparative Example 1. FIG. 6 shows the transmittance of the display device of each of this embodiment and Comparative Example 2. FIG. 7A, FIG. 7B and FIG. 7C are partial cross-sectional views of this embodiment, Comparative Example 1 and Comparative Example 2, respectively. FIG. 7A shows the components above the pixel electrode PE in the individual areas PAb of this embodiment, and is similar to FIG. 4. In Comparative Example 1 shown in FIG. 7B, only the insulating layer SEY3 is provided. In Comparative Example 2 shown in FIG. 7C, of the structural components of the pixels PX in the individual area PAa shown in FIG. 4, the layers except for the light-emitting layer ELL are provided. In other words, in Comparative Example 2, the hole injection layer HIY, the hole transport layer HTY, the electron blocking layer EBY, the hole blocking layer HBY, the electron transport layer ETY, the electron injection layer EIY, the common electrode CE, the insulating layer SEY1, the insulating layer SEY2 and the insulating layer SEY3 are provided. Particularly, FIG. 7C differs from FIG. 7A in that it includes an insulating layer SEY2 having a low refractive index.

In FIG. 5 and FIG. 6, the horizontal axis indicates the wavelength $\lambda$, (nm) and the vertical axis indicates the transmittance. In FIG. 5, the transmittance of the display device DSP of this embodiment is illustrated by a solid line, and that of Comparative Example 1 by a dashed line. In FIG. 6, the transmittance of the display device DSP of this embodiment is illustrated by a solid line, and that of Comparative Example 2 is illustrated by a single dashed line.

As shown in FIG. 5, the transmittance of the display device DSP is 75% or higher in a range of visible light, that is, for example, in a wavelength range of 400 nm to 700 nm. The transmittance of the display device DSP is substantially constant regardless of the wavelength.

The transmittance of Comparative Example 1, which has only the insulating layer SEY3, is substantially equivalent to that of the display device of this embodiment. In other words, FIG. 5 shows that the display device DSP can suppress the decrease in transmittance.

On the other hand, as shown in FIG. 6, in Comparative Example 2, which includes the insulating layer SEY2, the transmittance is 80% or less in a wavelength range of 400 nm to 500 nm. In Comparative Example 2, the transmittance is 70% or less at a wavelength of 500 nm or more. If the transmittance changes depending on the wavelength as in this case, the color of the display area DA changes from the desired color, which may cause a decrease in the range of color reproduction and a decrease in transmittance.

In this embodiment, the insulating layer SEY2 is not provided in the transparent areas, especially in the individual areas PAb, and therefore the above-mentioned unfavorable error does not occur.

In the display device DSP of this embodiment, the color reproduction range of the pixels PX can be expanded by the microcavity effect. On the other hand, in the transparent areas including the individual areas PAb and the blank region VAC, the low refractive-index insulating layer (the insulating layer SEY2) is not provided, and with this configuration, the lowering of the transmittance and the wavelength dependency of transmittance can be suppressed.

Configuration Example 1

Figure 8:
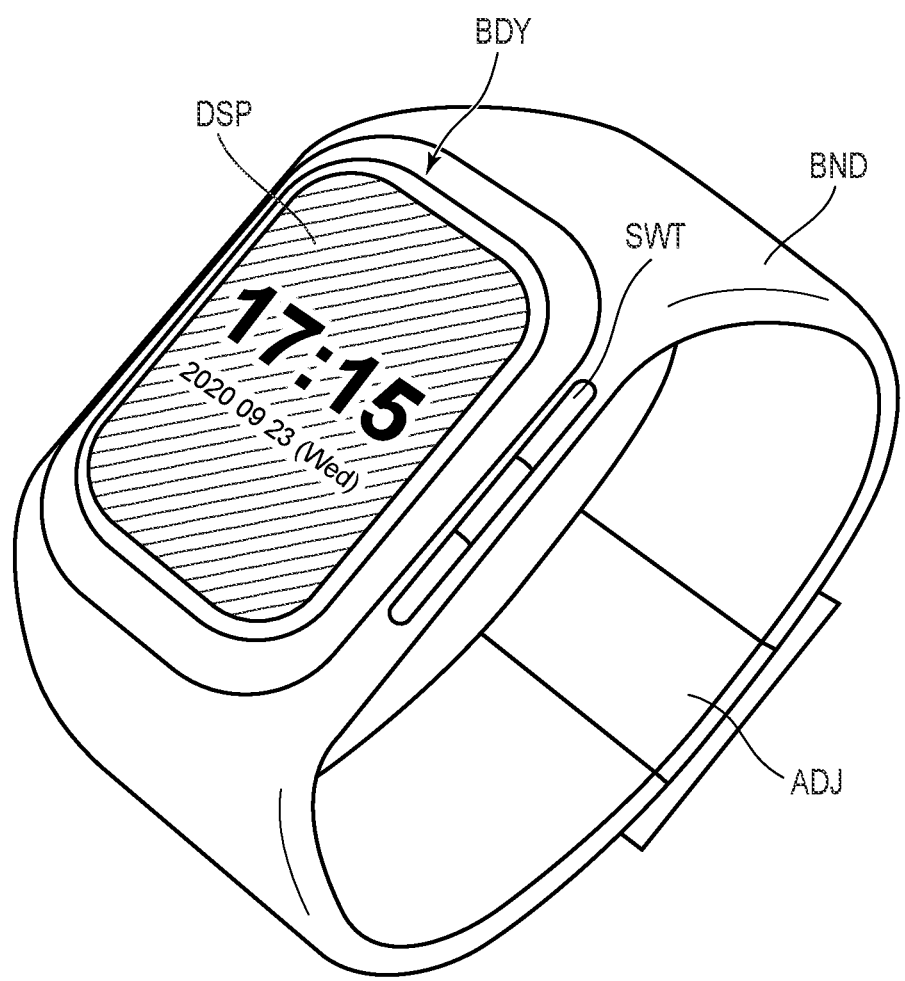
FIG. 8 is a perspective view showing an electronic apparatus using a display device of the embodiment.

FIG. 8 is a perspective diagram showing an electronic apparatus which employs the display device of the embodiment. FIG. 8 shows an electronic apparatus ERPm which is a wristwatch-type electronic apparatus that can be worn on the user's arm.

The electronic apparatus ERP includes a main body BDY including a display device DSP, a band portion BND used for wearing the main body BDY on an arm, and an adjustment portion for adjusting the fastened state of the band portion BND. The main body BDY includes an operation switch SWT. The operation switch SWT is assigned to such functions as a power input switch, a display switching switch and the like.

The display device DSP is such a display device as described above that can display, for example, the date, time, and the like in colored display images, and the rest in a transparent state.

In this configuration example as well, advantageous effects similar to those of the embodiment can be exhibited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first area including a pixel and a second area different from the first area, wherein
the pixel comprises a pixel electrode, an organic material layer including a light-emitting layer, a common electrode, a first insulating layer on the common electrode layer, a second insulating layer on the first insulating layer, the second insulating layer having a refractive index lower than that of the first insulating layer, and a third insulating layer on the second insulating layer, the third insulating layer having a refractive index higher than that of the second insulating layer,
the second area is an area not overlapping the light-emitting layer in plan view,
the second area is a transparent area, and
the second area comprises the first insulating layer and the third insulating layer provided therein, the second area does not comprise the second insulating layer.

2. The display device according to claim 1, wherein
the first area further includes a blank region which is different from the pixel, where the light-emitting layer is not provided, and
in the blank region, the first insulating layer is provided and the second insulating layer is not provided.

3. The display device according to claim 1, wherein
the common electrode includes a first common electrode and a second common electrode having a transmittance higher than that of the first common electrode, and
the first common electrode includes a magnesium-silver alloy (MgAg) or a ytterbium-silver alloy (YbAg).

4. The display device according to claim 1, wherein
the light emitting layer includes an organic electroluminescent light emitting material.

5. The display device according to claim 1, wherein
the organic material layer includes a hole injection layer, a hole transport layer, an electron blocking layer, the light emitting layer, a hole blocking layer, an electron transport layer, and an electron injection layer.

* * * * *